United States Patent [19]
Lim et al.

[11] Patent Number: 5,920,514
[45] Date of Patent: Jul. 6, 1999

[54] MEMORY DEVICE WITH EFFICIENT REDUNDANCY USING SENSE AMPLIFIERS

[75] Inventors: Hank H. Lim, Mountain View, Calif.; Brian Higgins, Boise, Id.

[73] Assignee: Micron Technology, Inc., Boise, Id.

[21] Appl. No.: 08/918,508

[22] Filed: Aug. 22, 1997

Related U.S. Application Data

[63] Continuation of application No. 08/751,002, Nov. 15, 1996, Pat. No. 5,694,368.

[51] Int. Cl.⁶ .................................................. G11C 13/00
[52] U.S. Cl. ............................................. 365/200; 365/210
[58] Field of Search .................................... 365/200, 210, 365/189.01, 230.01

[56] References Cited

U.S. PATENT DOCUMENTS

| | | | |
|---|---|---|---|
| 4,937,465 | 6/1990 | Johnson et al. | 307/202.1 |
| 5,110,754 | 5/1992 | Lowrey et al. | 437/57 |
| 5,212,442 | 5/1993 | O'Toole et al. | 324/158 |
| 5,279,975 | 1/1994 | Devereaux et al. | 437/8 |
| 5,280,205 | 1/1994 | Green et al. | 307/530 |
| 5,281,868 | 1/1994 | Morgan | 307/441 |
| 5,391,892 | 2/1995 | Devereaux et al. | 257/48 |
| 5,392,245 | 2/1995 | Manning | 365/200 |
| 5,424,672 | 6/1995 | Cowles et al. | 327/525 |
| 5,508,638 | 4/1996 | Cowles et al. | 326/38 |
| 5,528,539 | 6/1996 | Ong et al. | 365/200 |
| 5,574,698 | 11/1996 | Raad | 365/230.06 |
| 5,583,463 | 12/1996 | Merritt | 327/526 |

*Primary Examiner*—Terrell W. Fears
*Attorney, Agent, or Firm*—Schwegman, Lundberg, Woessner & Kluth, P.A.

[57] ABSTRACT

A memory device is described which has memory storage cells coupled to data bit lines. Sense amplifier circuits are provided to receive input from the data bit lines and produce an output in response thereto. The memory includes circuitry which shifts the input to the sense amplifiers. Data bit lines from a neighboring sense amplifier is shifted to another sense amplifier such that redundant memory storage cells and data bit lines can be substituted for defective ones.

23 Claims, 6 Drawing Sheets

MEMORY DEVICE WITH EFFICIENT REDUNDANCY USING SENSE AMPLIFIERS

This application is a continuation of U.S. Pat. application Ser. No. 08/751,002, filed Nov. 15, 1996.

TECHNICAL FIELD OF THE INVENTION

The present invention relates generally to memory devices and in particular the present invention relates to redundant circuitry in a memory device.

BACKGROUND OF THE INVENTION

An integrated circuit is a complete electronic circuit, containing transistors, diodes, resistors, and capacitors, along with their interconnecting electrical conductors, contained entirely within a single chip of silicon. Integrated circuits continue to decrease in size, and the circuits they contain continue to increase in complexity. This increases the chances of defective chips resulting from a failed element or a defective conductor.

One way to reduce semiconductor scrap is to provide redundant elements on the integrated circuits. If a primary element is defective a redundant element can be substituted for that defective element. One example of an integrated circuit device which uses redundant elements is electronic memory. Typical memory circuits comprise millions of equivalent memory cells arranged in addressable rows and columns. By providing redundant elements, defective memory cells or columns can be replaced. Because the individual primary memory cells of a memory are separately addressable, replacing a defective cell typically comprises opening fuse-type circuits to 'program' a redundant cell to respond to the address of the defective primary cell. This process is very effective for permanently replacing defective primary memory cells. For example, FIG. 1 illustrates a typical memory circuit where primary memory columns (PRIME$_0$ to PRIME$_i$) are selectively connected to data communication lines (DATA$_0$ and DATA$_i$). When a primary column is addressed via external address lines, the appropriate select signal (SEL$_0$ to SEL$_i$) is activated. If a primary column is determined to be defective, its select signal is forced to a permanent inactive state, and a compare circuit is programmed to activate an appropriate redundant select signal (RSEL$_0$ to RSEL$_i$). This programming is typically performed using fusible circuits. When an address of the defective column is provided on the address lines, the compare circuit responds by activating the redundant select signal to couple the redundant column to the appropriate data communication line.

Circuit designers continuously strive to achieve higher population capacities without a corresponding increase in physical size. Reducing the number of individual elements in integrated circuits is one way in which available die real estate is maximized. The above described redundancy scheme requires circuitry which adversely effects the available real estate and slows the operation of the memory.

For the reasons stated above, and for other reasons stated below which will become apparent to those skilled in the art upon reading and understanding the present specification, there is a need in the art for a memory device which reduces the area and operating time penalty due to redundancy.

SUMMARY OF THE INVENTION

The above mentioned problems with memory devices and other problems are addressed by the present invention and which will be understood by reading and studying the following specification. A memory is described which has memory storage cells coupled to data bit lines. Sense amplifier circuits are provided to receive input from the data bit lines and produce an output in response thereto. The memory includes circuitry which shifts the input to the sense amplifiers. Thus, input data bit lines for a first sense amplifier are shifted to a second sense amplifier such that redundant memory storage cells and data bit lines can be substituted for defective ones.

In particular, the present invention describes a memory device comprising memory storage cells for storing data, data communication lines coupled to the memory storage cells, sense amplifier circuits having multiple inputs coupled to the data communication lines. The plurality of sense amplifier circuits each having an output. The memory further comprises select circuitry connected to the sense amplifier circuits to couple one of the multiple inputs of each of the sense amplifier circuits to the output of the sense amplifier circuits.

In another embodiment, a memory device is described which comprises memory cells, a first pair of data communication bit lines, and a second pair of data communication bit lines. The memory also comprises addressing circuitry for selectively coupling the memory cells to the first and second pair of data communication bit lines, a first sense amplifier circuit coupled to the first and second pair of data communication bit lines for producing an output in response to the first pair of data communication bit lines, and select circuitry connected to the first sense amplifier circuit for enabling the first sense amplifier circuit to produce the output in response the second pair of data communication bit lines.

In another embodiment a method of providing redundancy in a memory device is described. The method comprises the steps of disabling a sense amplifier circuit associated with a first plurality of memory cells from producing an output in response to the first plurality of memory cells, and enabling the sense amplifier circuit associated with the first plurality of memory cells to produce the output in response to a plurality of redundant memory cells.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

In the most general sense, a memory circuit comprises memory cells which store data. Depending upon the type of memory, this data can be read, or read and written. That is, some memories are read-only while others allow data to be read, manipulated, and re-written. Because many types of dynamic memories store data as a charge on a capacitor, sense amplifiers are implemented to detect small charges and amplify the charge for further processing. Static memories utilize sense amplifier circuits to detect data stored in memory cells.

Dynamic Random Access Memories

Figure 1:
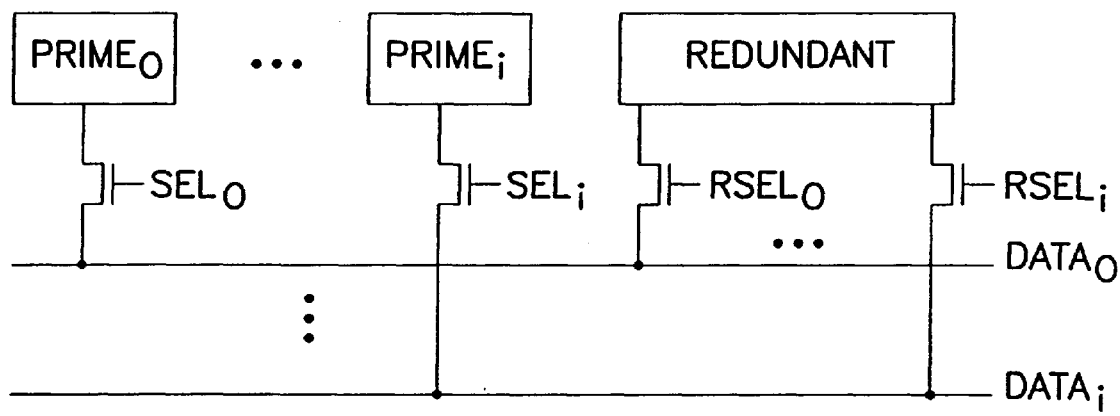
FIG. 1 is a block diagram of a portion of a prior art memory device.
Figure 2:
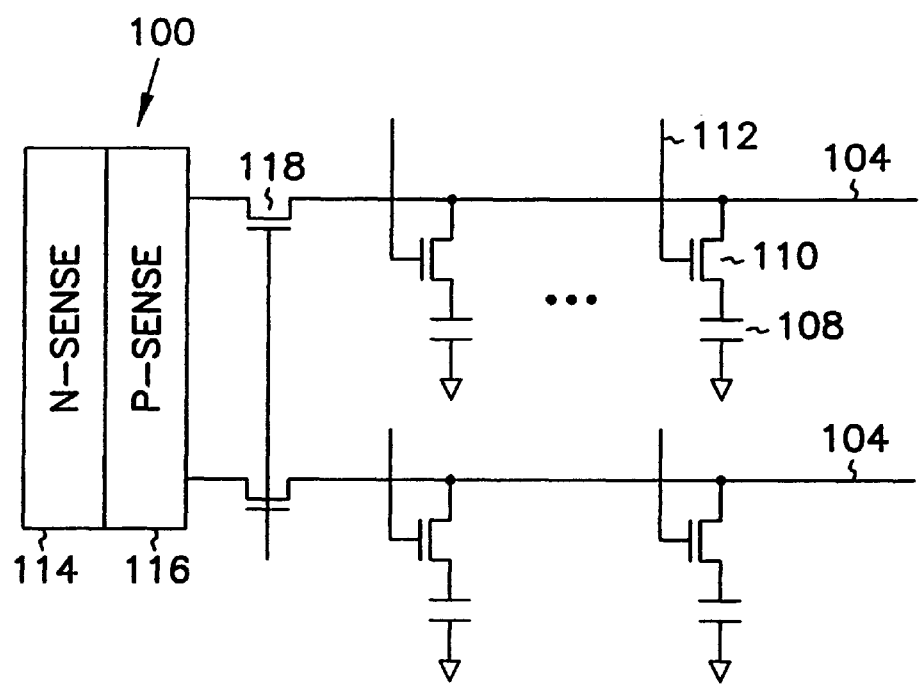
FIG. 2 is a schematic diagram of a portion of a dynamic random access memory (DRAM)

Dynamic random access memories (DRAM) typically use memory cells fabricated as capacitors. These cells can be selectively connected to digit lines 104 which are connected to a sense amplifier, as shown in FIG. 2. The memory cells 108 are each connected to the source of an access transistor 110. The drain of the transistor is connected to a digit line 104, or column of memory cells. The gate of the transistor is connected to a word line 112, or memory row, which is used to selectively connect one of the memory cells to the digit lines. The sense amplifier 100 is typically comprised of two amplifiers; an n-sense amp 114 and a p-sense amp 116. Isolation transistors 118 are provided between the digit lines 104 and the sense amplifiers 114 and 116.

To access and sense data in a memory cell 108, the digit lines 104 are pre-charged to Vcc/2 and then an access transistor 110 connected to a memory cell is selectively activated by providing a high voltage on its associated word line 112. The memory cell is then electrically connected to the digit line 104 through the access transistor. Any charge stored on the memory cell capacitor is shared with the digit line. The potential of the digit line will typically only change by a fraction of a volt, approximately 200 mv. The n-sense amplifier is activated to connect one of the digit lines 104 to a low voltage. If the selected memory cell 108 has data stored as a high voltage, the complementary digit line connected to the sense amplifiers will be forced low by the n-sense amp 116. Similarly, if the selected memory cell has data stored as a discharged capacitor the coupled digit line is forced low by the n-sense amp.

After the n-sense amp 114 has been activated, the p-sense amp 116 is activated. The compliment to the digit line, therefore, which was pulled low by the n-sense amp will be forced high using the p-sense amplifier. If the selected memory cell has data stored as a voltage, the coupled digit line will be forced high by the p-sense amp. Thus, by using both sense amplifiers the digit line associated with the memory cell has been forced to a power rail representing the data stored on the memory cell.

Static Random Access Memories

Static random access memories (SRAM) are similar to the above described DRAMs. Data is stored in memory cells which are selectively accessed through externally provided addresses. The typical static memory cell is a latch circuit which is more complicated than the typical dynamic memory cell, thereby reducing the available memory density of SRAMs. SRAMs, however, can be operated at faster data rates and are ideal for applications such as cache memories.

Figure 3:
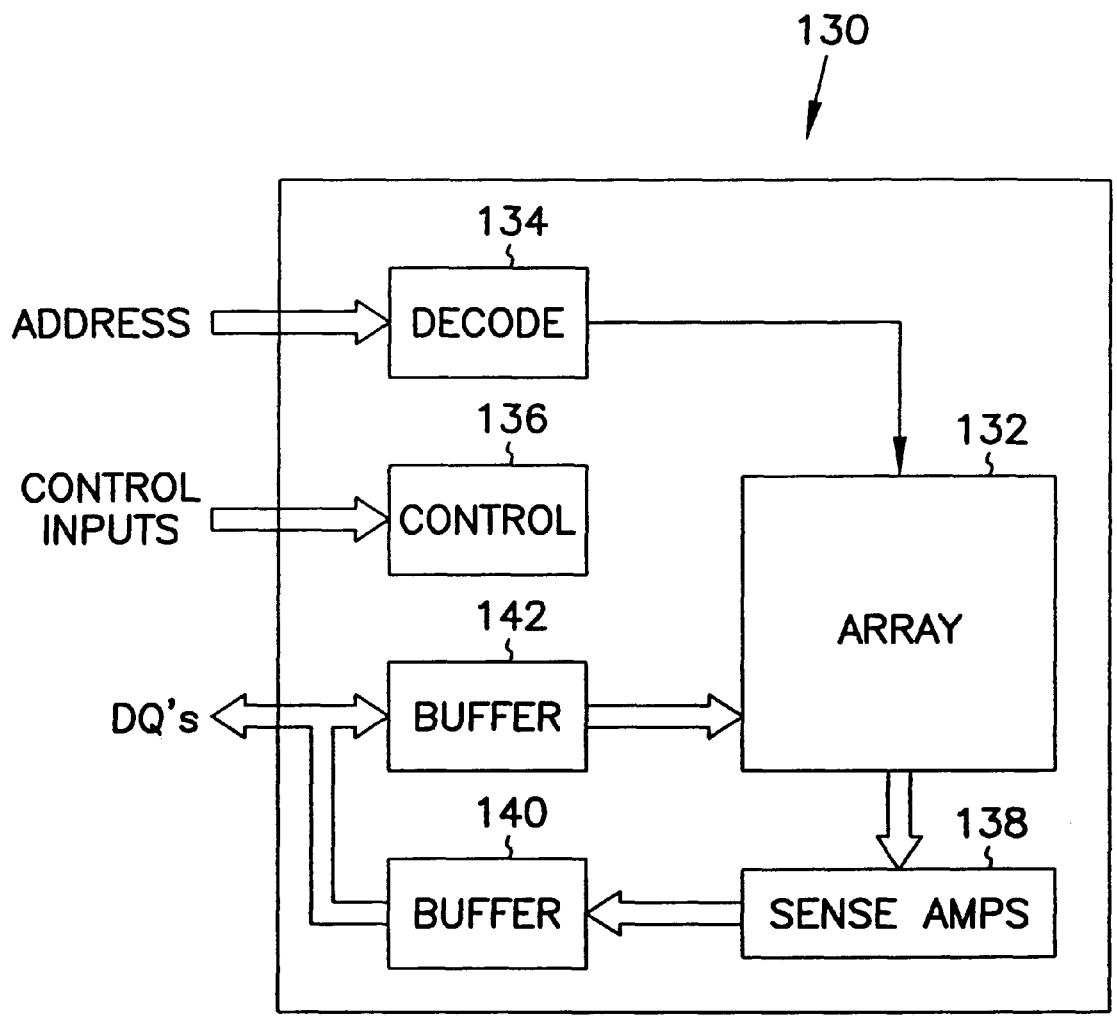
FIG. 3 is a block diagram of a static random access memory (SRAM)

Referring to FIG. 3, a block diagram of the a typical SRAM 130 is described. The SRAM includes a memory array 132 of static memory cells. Address decode circuitry 134 is provided to decode an address provided on the address inputs and access the memory array. Control circuitry 136 controls the read and write operations performed by the memory in response to external control inputs. Data read from the memory array is sensed and amplified by sense amplifier circuit 138 and output on data communication lines (DQ) via output buffer 140. Data provided on the DQ lines is written to the memory array through input buffer/driver circuit 142.

Figure 4:
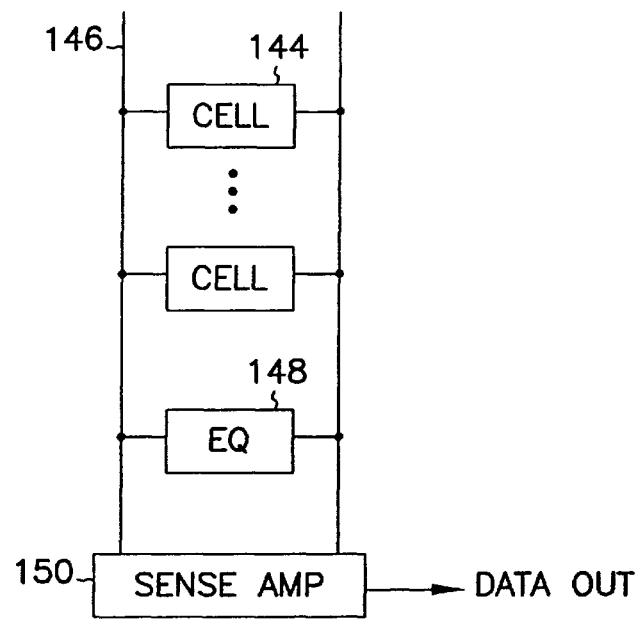
FIG. 4 illustrates one column of a typical SRAM of FIG. 3.

Memory array 132 is arranged in rows and columns of memory cells. The columns are defined by a pair of bit lines which communicate data stored in the memory cells to the sense amplifier circuits. The bit lines are complements of each other such that in an active state one bit line will be at a low signal level and the other bit line will be at a high signal level. FIG. 4 illustrates one column of a typical SRAM. The memory cells 144 are selectively connected to one of a pair of bit lines 146 in response to address decode circuitry 134. Equilibrate circuit 148 is provided to equalize the bit line pair to a pre-determined voltage prior to reading data from the memory cells, as known to those skilled in the art. When a memory cell is coupled to a bit line, the equilibrated bit line voltage will be adjusted to reflect the data stored in the selected memory cell. For example, if the bit line where pre-charged to a high voltage and the data stored on a selected memory cell is represented by a low voltage, the bit line voltage will be reduced to a low voltage.

Sense amplifier circuity 150 is a subset of sense amplifier 138 and typically comprises a two-stage circuit. One of the stages senses the bit line which has a higher voltage and amplifies that bit line voltage to a higher level. The other stage senses the bit line with the lower voltage and amplifies that voltage to a lower voltage level. The amplified bit line voltages are then provided to a buffer circuit for communication to the DQ lines.

It will be appreciated that the above described DRAM and SRAM include circuitry not described in detail herein. The description of these memories is intended to provide a basic understanding of memories so that the features and advantages of the present invention can be fully understood. The present invention is described in detail as being incorporated in an SRAM, but can be equally incorporated in any memory circuit using sense amplifier circuitry, such as DRAMs.

Redundant Circuitry

Figure 5A:
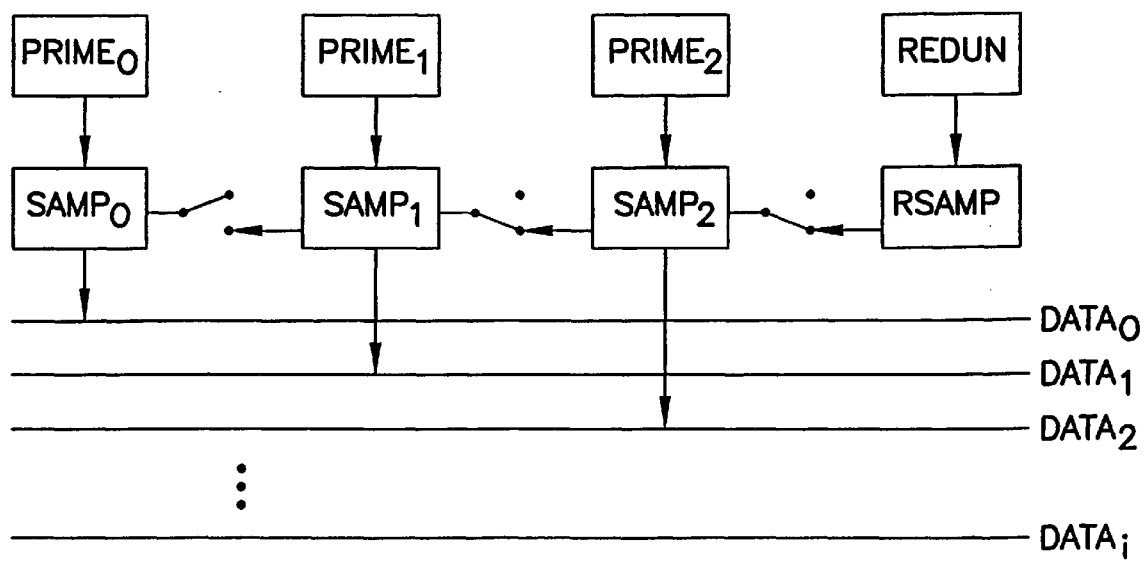
FIG. 5a is a block diagram of the read circuitry of present invention.
Figure 5B:
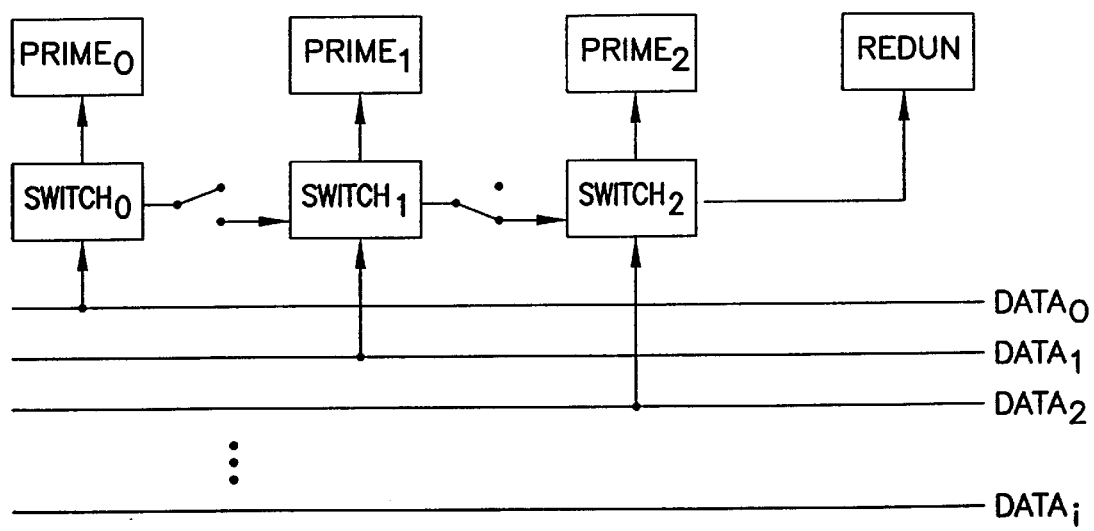
FIG. 5b is a block diagram of the write circuitry of present invention.

The read circuitry of the present invention, as illustrated in FIG. 5a, can be implemented in any integrated circuit, including but not limited to SRAMs and DRAMs, to provide a redundancy scheme where a defective primary column of memory cells can be replaced with a redundant column. The present invention eliminates the need for either primary column disabling circuitry or redundant column compare and select circuitry, as described above in the background. The redundant scheme provides a memory device in which the sense amplifier circuits associated with the memory columns can be enabled to accept input from its nearest neighboring column. Switching circuitry is provided which allows the sense amplifier of a defective column to bypass the defective column and multiplex the redundant column. As illustrated in FIG. 5, sense amplifier $SAMP_1$ accepts input from column $PRIME_2$ and data is output on $DATA_1$ while $SAMP_2$ accepts input from redundant column REDUN and data is output on $DATA_2$.

5b illustrates the switching circuitry used to write data to the primary and redundant columns. The switching circuitry is programmed to route input data to the appropriate column in accordance with the sense amplifier routing discussed with reference to FIG. 5a. The write circuitry includes switches labeled Switch0 to Switch2 which route input data from communication lines DATA0 to DATA1 to the memory columns. In this illustration, DATA0 is routed to PRIME0, DATA1 is routed to PRIME2, and DATA2 is routed to REDUN. It will be appreciated by those skilled in the art that any switching circuitry can be implemented to insure that bidirectional communication is maintained with the columns.

Figure 6:
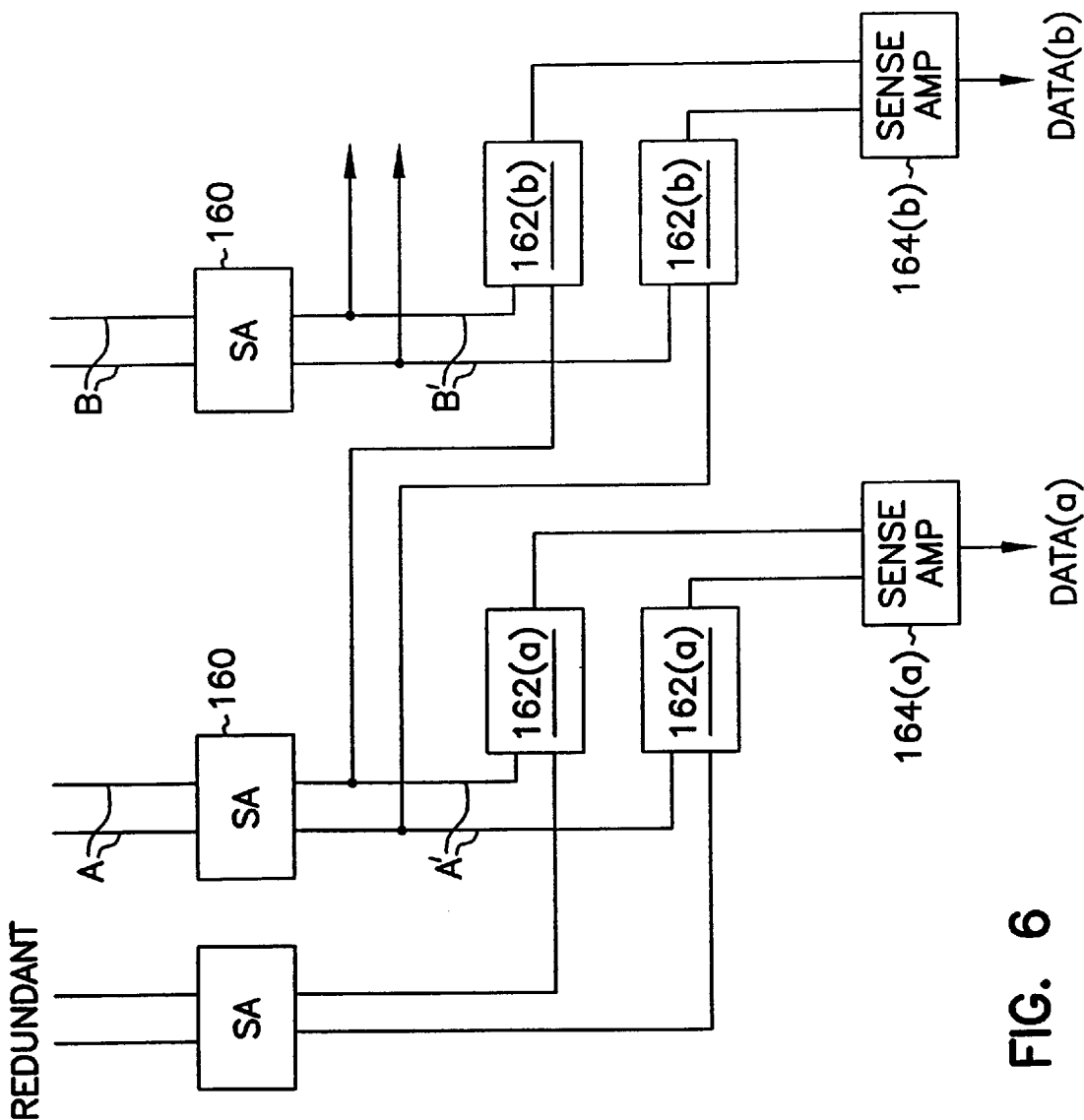
FIG. 6 is a block diagram of an SRAM incorporating the present invention.
Figure 7:
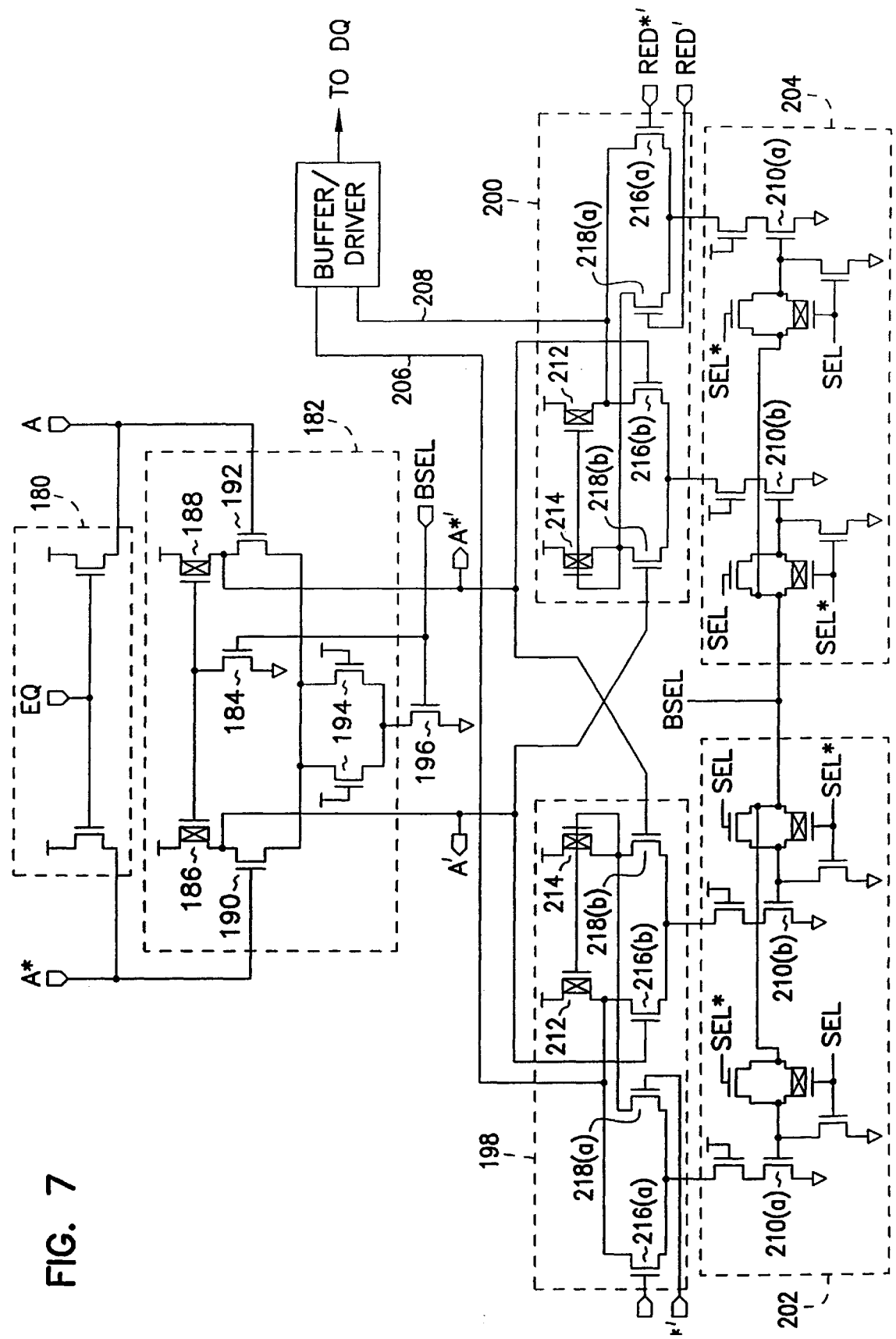
FIG. 7 is a schematic diagram of one embodiment of sense amplifier and select circuitry of FIG. 6.

A more detailed description of one embodiment of the switching circuitry used in an SRAM is provided with reference to FIGS. 6 and 7. FIG. 6 illustrates two pairs of bit lines A and B each having an associated first sense amplifier stage 160. The first stage couples the bit lines to intermediate bit line pairs A' and B'. Sense amplifier select circuitry 162(a) and (b) are provided to couple one pair of intermediate bit lines to the second stage sense amplifier circuit 164(a) and (b). Intermediate bit lines A' or intermediate bit lines B' will, therefore, be coupled to sense amplifier 164(b). If intermediate bit lines A' are coupled to the sense amplifier 164(b), intermediate bit lines B' can either be coupled to the next sense amplifier circuit 164(c) (not shown) using its sense amplifier select circuitry 162(c) (not shown), or not coupled to sense amplifier 164(c) if bit line pair B or memory cells coupled thereto are defective. The redundant column can be coupled to sense amplifier 164(a) through sense amplifier select circuit 162(a) for output on DATA(a).

FIG. 7 is a detailed schematic of one pair of bit lines A and A*, select circuit, sense amplifier select circuit and two stage sense amplifier. Bit lines A and A* are connected to equilibration circuit 180 to pre-charge the bit lines to a high voltage prior to reading a memory cell. First stage sense amplifier 182 receives bit lines A and A*. When block select signal (BSEL) is high, transistor 184 is activated which activates transistors 186 and 188. The drains of transistors 190 and 192 and intermediate bit lines A' and A'* and are coupled low through transistors 194 and 196, respectively, when the bit lines A and A* are high. When one of the bit lines goes low, either transistor 190 or 192 is turned off and the corresponding intermediate bit line is pulled high through either transistor 186 or 188.

The second stage of the sense amplifier circuit is illustrated in two halves 198 and 200. Sense amplifier half 198 provides output 206, while half 200 provides output 208. Each half of the second stage sense amplifier is coupled to either intermediate bit line pairs A' and A'* or the intermediate bit line pair of the neighboring column, RED' and RED'*. It will be understood that the neighboring column in this illustration is a redundant column, but can be any neighboring column and not limited to redundant circuits. Select circuits 202 and 204 are connected to sense amplifier halves 198 and 200, respectively, and are used to enable the sense amplifier halves. Each select circuit comprises pull-down transistors 210(a) and 210(b) which are activated in response to a select signal (SEL). The SEL is preferably an internal signal provided by a redundancy enable circuit such as a fuseable link, as known to those skilled in the art. Either transistor 210(a) or 210(b) will be activated by the SEL signal to couple the appropriate intermediate bit line pair to the second stage sense amplifier circuit.

The second stage sense amplifier halves include current mirror circuits comprised of transistors 212 and 214. The sources of transistors 212 and 214 are connected to transistors 216(a)–(b) and 218(a)–(b), respectively. Transistors 216(a)–(b) and 218(a)–(b) are also coupled to pull-down transistors 210(a) or 210(b). By controlling the select signal SEL, the intermediate bit line pair which is to be coupled to outputs 206 and 208 can be selected. That is, when SEL is high transistor 210(b) is activated and transistors 216(b) and 218(b) respond to intermediate bit lines A' and A'*. If SEL is low, transistors 216(a) and 218(a) respond to intermediate bit lines RED' and RED'*. The current mirror circuit of each half of the second sense amplifier stage in combination with either transistors 216(a) and 218(a) or 216(b) and 218(b) produce a differential output on line 206 and 208. Outputs 206 and 208 are connected to buffer/driver circuitry for output on the DQ lines.

Conclusion

A memory device has been described which has memory storage cells coupled to data bit lines. Sense amplifier circuits are provided to receive input from the data bit lines and produce an output in response thereto. The memory includes redundant circuitry which shifts the input to the sense amplifiers. Data bit lines from a neighboring sense amplifier are shifted to another sense amplifier such that redundant memory storage cells and data bit lines can be substituted for defective ones. The redundant circuitry can be used on any type of memory circuit having memory cells coupled to data communication lines, including but not limited to DRAM, SDRAM, SRAM and VRAM's.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the present invention does not have to be used in a memory having bit line pairs, but can be used equally in a memory having a single bit line communication. Further, any latch-type circuit can be substituted for the sense amplifier circuitry to selectively couple data from memory cells to data outputs. Therefore, it is manifestly intended that this invention be limited only by the claims and the equivalents thereof.

What is claimed is:

1. A sense amplifier circuit for use in a memory device comprising:

a first differential amplifier stage coupled to a first pair of digit lines for providing an output into response to the first pair of digit lines;

a second differential amplifier stage coupled to a second pair of digit lines and the output of the first differential amplifier stage for providing an output in response to either the second pair of digit lines or the output of the first differential amplifier stage; and select circuitry coupled to the second differential amplifier stage for enabling the second differential amplifier stage to provide the output in response to either the second pair of digit lines or the output of the first differential amplifier stage.

2. The sense amplifier circuit of claim 1 wherein the select circuitry receives a select signal for enabling the second differential amplifier stage.

3. The sense amplifier circuit of claim 2 wherein the select signal is provided using a fuse link.

4. The sense amplifier circuit of claim 1 wherein the memory device is a dynamic random access memory (DRAM).

5. The sense amplifier circuit of claim 1 wherein the memory device is a static random access memory (SRAM).

6. The sense amplifier circuit of claim 1 wherein the second differential amplifier stage comprises:

first and second sense amplifier halves;

the first sense amplifier half comprises a pull-up circuit connected to the output of the first differential amplifier stage and the second pair of digit lines, the first sense amplifier half is connected to a first output line; and the second sense amplifier half comprises a pull-up circuit connected to the output of the first differential amplifier stage and the second pair of digit lines, the second sense amplifier half is connected to a second output line.

7. The sense amplifier circuit of claim 6 wherein the select circuitry comprises:

first and second select circuitry halves, the first select circuitry half is coupled to the first sense amplifier half and includes pull-down circuitry, the second select circuitry half is coupled to the second sense amplifier half and includes pull-down circuitry.

8. The sense amplifier circuit of claim 1 wherein the first differential amplifier stage can be selectively deactivated to decouple the first differential amplifier stage from the second differential amplifier stage.

9. The sense amplifier circuit of claim 1 wherein the second pair of digit lines are a pair of redundant digit lines coupled to redundant memory cells.

10. A method of coupling memory digit lines to input/output data communication lines, the method comprising the steps of:

coupling first and second pairs of digit lines to a sense amplifier circuit; and selectively enabling the sense amplifier circuit to produce an output in response to either the first or the second pair of digit lines.

11. The method of claim 10 further comprising this step of:

de-coupling the first pair of digit lines from the sense amplifier circuit when the sense amplifier circuit is enabled to produce an output in response to the second pair of digit lines.

12. The method of claim 10 wherein the second pair of digit lines is a redundant pair of digit lines coupled to redundant memory cells.

13. The method of claim 10 wherein the step of selectively enabling comprises the sub-step of:

activating either a first or a second pull-down circuit coupled to this sense amplifier circuit.

14. The method of claim 13 wherein either the first or second pull-down circuit is activated by a select signal.

15. The method of claim 14 wherein the select signal is produced using a fuse circuit.

16. A method of providing redundancy in a memory device having first and second adjacent memory array columns respectively coupled to first and second sense amplifier circuits, the method comprising the step of:

re-routing the second memory array column through the first sense amplifier circuit such that the first sense amplifier circuit produces an output in response to the second memory array column.

17. The method of claim 16 wherein the first memory array column is defective, the method further comprising the step of:

de-coupling the first memory array column from the first sense amplifier circuit.

18. A sense amplifier circuit for use in a memory device comprising:

a first amplifier circuit comprising a first pull-up circuit and a first pull-down circuit coupled together by a first isolation transistor, a gate of the first isolation transistor is connected to a first digit line, the first amplifier circuit provides an output signal in response to the first digit line and can be selectively de-activated to disable the output signal;

a second amplifier circuit comprising:

a second pull-up circuit, and second and third pull-down circuits respectively coupled to the second pull-up circuit through second in the third isolation transistors, a gate of the second isolation transistor is coupled to receive the output signal from the first amplifier circuit, a gate of the third isolation transistor is coupled to receive an output signal from an adjacent amplifier circuit; and a select circuit coupled to the second and the third pull-down circuits for enabling the second amplifier circuit to produce an output signal in response to either the first amplifier circuit or the adjacent amplifier circuit.

19. The sense amplifier circuit of claim 18 wherein the select circuitry receives a select signal for enabling either the second and the third pull-down circuits.

20. The sense amplifier circuit of claim 19 wherein the select signal is provided using a fuse link.

21. The sense amplifier circuit of claim 18 wherein the memory device is a dynamic random access memory (DRAM).

22. The sense amplifier circuit of claim 18 wherein the memory device is a static random access memory (SRAM).

23. The sense amplifier circuit of claim 18 wherein the first amplifier circuit is selectively de-activated by disabling the first pull-down circuit.

* * * * *